United States Patent [19]
Suzuki et al.

[11] Patent Number: 5,108,778
[45] Date of Patent: Apr. 28, 1992

[54] SURFACE TREATMENT METHOD

[75] Inventors: Keizo Suzuki, Kodaira; Susumu Hiraoka, Kokubunji; Tatsumi Mizutani, Koganei; Shigeru Nishimatsu, Kokubunji, all of Japan

[73] Assignee: Hitachi, Ltd., Tokyo, Japan

[21] Appl. No.: 511,946

[22] Filed: Apr. 16, 1990

Related U.S. Application Data

[63] Continuation of Ser. No. 202,483, Jun. 6, 1988, abandoned.

[30] Foreign Application Priority Data

Jun. 5, 1987 [JP] Japan .................................. 62-139724
Sep. 2, 1987 [JP] Japan .................................. 62-217807

[51] Int. Cl.$^5$ ............................. B05D 3/06; B44C 1/22
[52] U.S. Cl. ........................................ 427/38; 427/35;
427/53.1; 427/54.1; 156/643; 156/646;
156/662; 156/664
[58] Field of Search ............... 427/38, 53.1, 35, 54.1;
156/643, 646, 662, 664; 204/298.36; 118/620

[56] References Cited

U.S. PATENT DOCUMENTS 4,522,674 6/1985 Ninomiya et al. ................... 156/345

FOREIGN PATENT DOCUMENTS 58-202533 11/1983 Japan .................................. 118/723
61-113775 5/1986 Japan .
2141386A 12/1984 United Kingdom .
2164581A 3/1986 United Kingdom .

OTHER PUBLICATIONS

Rettner et al., "Dissociative Chemisorption of $CH_4$ on W(110); Dramatic Activation by Initial Kinetic Energy", Phys. Rev. Lett. 54(25) Jun. 1985 pp. 2716–2719.
Shapiro, "The Dynamics and Thermodynamics of Compressible Fluid Flow", Ronald Press Company, N.Y., 1953 pp. 71–111.

Primary Examiner—Shrive Beck
Assistant Examiner—Roy V. King
Attorney, Agent, or Firm—Antonelli, Terry, Stout & Kraus

[57] ABSTRACT

Disclosed are a surface treatment method and apparatus in which an active species beam that contains active species having translational energy in a range of 0.01–100 eV as at least a partial constituent thereof constructs at least a part of treatment means.

25 Claims, 9 Drawing Sheets

FIG. 1

EVACUATION

EVACUATION

SURFACE TREATMENT METHOD

This application is a continuation of application Ser. No. 07/202,483, filed Jun. 6, 1988, now abandoned.

BACKGROUND OF THE INVENTION

The present invention relates to dry processes for treating the surfaces of solids, and more particularly to a surface treatment method and apparatus which can realize a damage-free, contamination-free, highly selective and low temperature process well suited to the fabrication of semiconductor devices. In the fields of surface treatments, especially the field of the fabrication of semiconductor devices, dry processes have been often adopted for about ten years. Here, the "dry process+ is an expression as opposed to a wet process (a method employing an aqueous solution) practised before, and it is a method in which the surface of a sample is treated in vacuum (including light) or in a gaseous phase. In the conventional dry process, a plasma or an ion beam has been used as the gaseous phase, and the kinetic energies of electrons, ions and the ion beam entering the sample surface have been distributed at several eV-$10^4$ eV (refer to FIG. 2). Meanwhile, the displacement energy of an atom within a crystal (energy required for displacing an atom from the regular crystal lattice position thereof), $E_d$ is about 10 eV. By way of example, $E_d = 12.9$ eV holds in an Si crystal (G. Carter and J. S. Colligon, "Ion Bombardment of Solids", Heineman Educational Books Ltd., London, 1968, p. 214). With the dry process, therefore, damages have heretofore been inevitably formed in the sample surface. Moreover, the temperature of the sample has risen due to the entrance of such high energy particles and has sometimes exceeded 300° C. Such a temperature rise of the sample has formed other crystal defects (damages) in the sample surface or has extremely narrowed the application range of the process. Besides, when such high energy particles have entered the surface of a solid near the sample, they have physically and chemically sputtered the surface substance, and the sputtered substance has re-deposited on the sample surface to contaminate it. As the dimensions of semiconductor devices decrease (to 1 μm or less), the damages, contamination and device temperature rise as stated above become serious problems. In addition, such damages, contamination and temperature rise will be fatal to three-dimensional semiconductor devices expected to be realized in the near future, and the conventional dry processes will become unfeasible.

Figure 2:
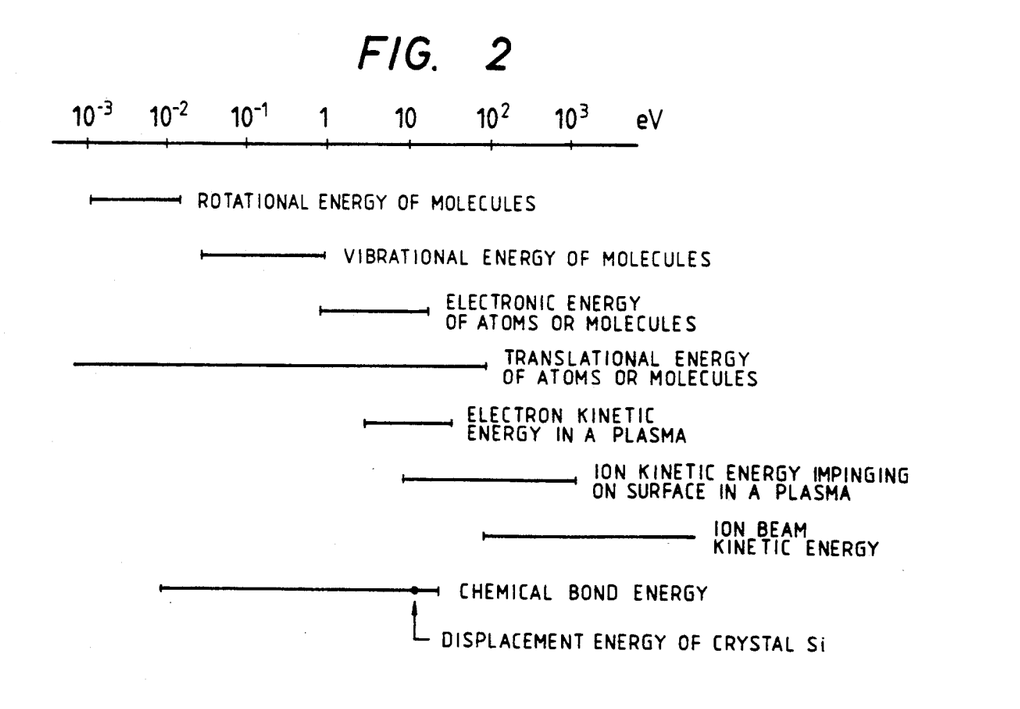
FIG. 2 is an explanatory diagram showing the magnitudes of various energies.

Essential items which ought to be done in surface treatments are to remove the substances of the sample surface through physical and chemical reactions on the sample surface or in the gaseous phase (etching), to deposit a substance on the sample surface (deposition or epitaxy), and to modify the characteristics of the substance of the sample surface (any of oxidation, nitridation, etc.). In this case, the chemical reactions play the principal roles rather than the physical reactions. The reason is that the chemical reactions can realize more reactive varieties. Now, energy levels concerning the chemical reactions (chemical bond energy) are distributed at 0.01-10 eV as shown in FIG. 2, and energy which gives rise to crystal defects is about 10 eV. Accordingly, a range of 0.01-10 eV is suitable as energy levels which are employed for executing the surface treatment. In actuality, however, all the energy supplied to the surface is not consumed for forming the crystal defects. Therefore, the upper limit of the energy can be increased about 10 times. That is, approximately 0.01-100 eV are the optimum as the energy which is supplied to the surface in order to perform the surface treatment.

As indicated in FIG. 2, the magnitudes of energies possessed by atoms or molecules (hereinbelow, termed "species"), namely, the rotational energy of molecules, the vibrational energy of molecules, the electronic energy of atoms or molecules and the translational energy of atoms or molecules can be controlled into the energy range (0.01-100 eV) mentioned above. Accordingly, these energies can be employed as the supply energy to the surface for performing the surface treatment. That is, atoms or molecules the whole energy $E_w$ of which falls within the range of 0.01-100 eV (hereinbelow, such atoms or molecules shall be termed "active species") are caused to enter the surface thereby to perform the surface treatment, whereby the surface treatment having no surface damage (or having very little surface damages) can be carried out. Here, the whole energy $E_w$ is expressed as:

$$E_w = E_r + E_v + E_e + E_t$$

$E_r$: rotational energy,
$E_v$: vibrational energy,
$E_e$: electronic energy,
$E_t$: translational energy.

A surface treatment method wherein a molecular beam in which a vibrational state $E_v$ among the states of the four kinds of energies ($E_r$, $E_v$, $E_e$, $E_t$) is excited is projected on a sample so as to treat the surface thereof, is disclosed in the official gazette of Japanese Patent Application Laid-open No. 113775/1986. In addition, a surface treatment apparatus wherein a gas is heated to excite the rotational state, vibrational state and electronic state of gas species, which are thereafter emitted into vacuum and turned into a beam, which is projected on a sample so as to treat it, is disclosed in the official gazette of Japanse Patent Application Laid-open No. 35521/1988 (U. S. Patent Application Ser. No. 891,641, now U.S. Pat. No. 4,697,836). As indicated in FIG. 2, however, the maximum value of the vibrational energy is at most 1 eV, and even the energy of the electronic state does not reach 100 eV. Insofar as the aforementioned value of 100 eV is not exceeded, the energy of the species with which the sample is irradiated should desirably be greater because the throughput of the surface treatment can be raised. Nevertheless, an energy level higher than 10 odd eV cannot be attained by the energies of the rotational state, vibrational state and electronic state which are utilized for the energy supply to the sample in the prior-art techniques. Besides, it is difficult that these energies are independently controlled so as to adjust the species beam to a desired energy level. Further, these energies are discrete and cannot be set at any desired energy levels.

SUMMARY OF THE INVENTION

An object of the present invention is to provide a surface treatment method and apparatus which lessen the damages, contamination and temperature rise of a sample, which raise the surface treatment rate of the sample and which is suited to control the surface treatment state of the sample.

The above object is accomplished in such a way that the sample is treated by a species beam which contains species having a translational energy level of 0.01–100 eV. The translational energy $E_t$ is continuously distributed even quantum-mechanically, and it is controllable in a wide range of $10^{-3}$ eV to $10^2$ eV as shown in FIG. 2. In case of employing it as feed energy to a sample surface, therefore, both the high throughput of the surface treatment and the control of the treatment state of the sample can be satisfied.

The expression "species" in this specification shall cover both particles (atoms or/and molecules) which are electrically neutral and particles which are ionized to be positive or negative. In this regard, however, when the ionized species incide on the surface of an electric insulator, the surface is charged, and the charges can form the cause of the occurrence of damages. In addition, the energy and trajectory controls of the incident species become difficult. Accordingly, especially the electrically neutral species (called "neutral species") among the species are valuable in practical use.

In general, as compared with the species having charges, the electrically neutral species are much more difficult of being accelerated to a high speed, thereby to obtain a beam of neutral active species of high translational energy, namely, to obtain a beam of fast neutral species. (The expression the "beam of species" signifies a group of species flying in a specified direction with substantially no collisions.) One expedient for obtaining the fast neutral species beam is a method in which a gas is spurted into vacuum to form a so-called supersonic flow. This method is discussed in A. H. Shapiro; "The Dynamics and Thermodynamics of Compressible Fluid Flow" (The Ronald Press Company, New York, 1953), pp. 71–111. By heating the gas before the spurt, the translational energy ($E_t$) of the fast neutral species beam can be increased. Even with this measure, however, the level of the energy $E_t$ attained is usually 1 eV or less.

On the other hand, when the application of the fast neutral species beam to surface treatment technology is considered, the translational energy $E_t$ should desirably be greater as long as it does not exceed about 100 eV. The reason is that a chemical reaction is ordinarily employed in the surface treatment and that, as the energy $E_t$ is greater, the chemical reaction is promoted more, so the throughput (the rate of the treatment) rises more. However, when the energy $E_t$ is too great, surface damages appear to give rise to an unfavorable situation.

As an expedient for attaining an $E_t$ level of about 10 eV, a method called "seeding" has been known. An example employing the seeding is found in a literature, C. T. Rettner et al.; "Dissociative Chemisorption of $CH_4$ on W(110)", Phys. Rev. Letts. 54, (1985) pp. 2716–2719. The seeding is the method in which a gas of great mass (per species or particle) (gas B) is mixed into a gas of small mass (gas A), and the mixed gas is heated to a high temperature and then spurted into vacuum, thereby to obtain the species beam of the B species of great $E_t$ (species constituting the gas B). It is realized in such a way that the A species which exhibit a high speed owing to the small mass accelerate the B species which have the great mass and are slow, through collisions. When the B species have been accelerated up to the same speed as that of the A species, the following holds:

$$E_{tB} = \frac{m_B}{m_A} E_{tA} \qquad [1]$$

$E_{tX}$; translational energy of X species beam,
$m_X$; mass of X species.

By way of example, when $Cl_2$ is employed as the B species and He as the A species, $m_B/m_A \cong 17.5$ holds, and 17.5 eV can be realized as $E_{tB}$ by realizing 1 eV as $E_{tA}$. Although the above description has referred to the method of accelerating the species B with the species A, the converse is also possible at need. That is, using species A which are greater in mass than species B, the species B can be decelerated with the species A. However, the method stated earlier is more valuable in practical use.

The seeding as described above has the following problems:

(1) Assuming the gas B to be a chemically active gas, the inner wall of a heating vessel reacts with the gas B in the course in which the mixed gas is heated. For this reason, the mixed gas cannot be sufficiently heated, so that a large value of $E_{tB}$ cannot be attained.

(2) Assuming the gas B to be liable to dissociation, it dissociates in the course in which the mixed gas is heated. Therefore, a large value of $E_{tB}$ cannot be attained without dissociating the gas B.

The gases which are employed in the surface treatment technology, often have the properties of being chemically active and being liable to dissociation. Therefore, the aforementioned problems indicate limitations in the case of applying the seeding to the surface treatments.

There will now be described the principle of a species beam-forming expedient according to which the above problems are solved, and gas species having the properties of being chemically active and being liable to dissociation can be accelerated to a high speed so as to obtain a fast neutral species beam well suited to surface treatments.

This expedient is characterized in that the gas A is heated beforehand, and that the gas B is mixed into the gas A immediately before, amidst, or after the spurt of the gas A into vacuum.

Thus, the gas B itself is not heated to a high temperature, so that it does not react with the inner wall of the heating vessel and does not dissociate, either. In contrast, the gas A has been heated to a necessary temperature, so that after the spurt, both the A and B species become fast, and a large value of $E_{tB}$ can be realized. Assuming that the speeds of the species A and the species B equalize finally, Eq. [1] holds as in the seeding.

For realizing such an operation, the number of times of the collisions between the species A and B after the gas B has been mixed into the gas A need to be held at a suitable number. More specifically, when the number of times of the collisions is too small, the species B are not sufficiently accelerated, and the large value of $E_{tB}$ cannot be attained, whereas when the number of times of the collisions is too large, the internal energy of the species B increases, and the reaction thereof with the inner wall or the dissociation thereof takes place. Although the suitable number of times of the collisions changes depending upon the combination of the A and B gases, it is usually 1–1000 or so.

Figure 3A:
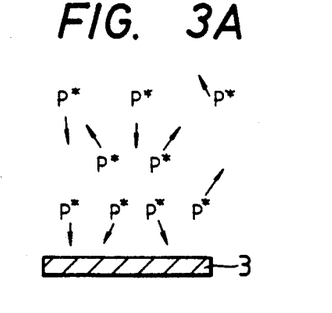
FIGS. 3A and 3B are conceptual views for explaining the behaviors of species beams.
Figure 3B:
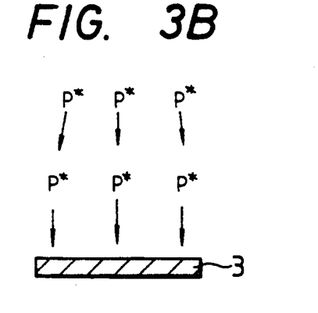

Now, in surface treatments which are conducted by the use of active species, there are a method as shown in FIG. 3A wherein a group of active species exhibiting an isotropic velocity distribution are employed for supplying the active species to the surface of a sample 3, and a method as shown in FIG. 3B wherein a group of active species exhibiting an anisotropic velocity distribution (that is, an active species beam) are employed. In the figures, P* species. Generally in the denotes the active surface treatments, processing which is anisotropic to the sample surface (for example, anisotropic etching) is often required, and the use of the active species beam is recommended. Moreover, the controllability of the process is enhanced by the use of the active species beam.

On the basis of the above concept, the present invention provides a surface treatment method in which an active species beam composed of active species having translational energy levels in a range of 0.01-100 eV is employed as at least a part of surface treatment means, and a surface treatment apparatus which can realize the method.

In the present invention, since the active species whose translational energy levels are 0.01-100 eV are employed, a surface treatment with no damages (or with very little damages) is possible. Besides, since the active species are supplied to the surface in the form of an anisotropic beam, a directional surface treatment becomes possible.

DESCRIPTION OF THE PREFERRED EMBODIMENTS

Figure 1:
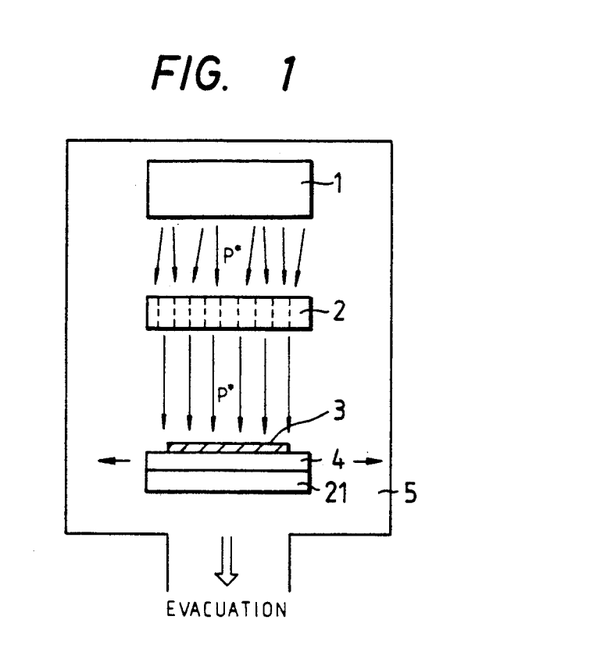
FIG. 1 is a constructional view of an embodiment of a surface treatment apparatus according to the present invention.

An embodiment of a surface treatment apparatus according to the present invention is shown in FIG. 1. The embodiment comprises active species beam-generating means 1, a collimator 2, and a smaple stand 4 for a sample 3. The collimator and the sample stand 4 bearing the sample 3 are installed within a vacuum chamber 5. The active species beam-generating means 1 is means for generating a beam of active species. The collimator 2 serves to adjust the velocity distribution of the active species forming a beam when passed therethrough, more into one direction. This collimator can be constructed of. for example, innumerable pores which penetrate a collimator body in the passing direction of the beam. The active species having collided against the walls of the pores lose their energies, and fail to be active. Therefore, the flying directions of the active species after having passed through the collimator 2 become more uniform. By cooling the walls which define the pores, the function of the collimator 2 can be further enhanced. The sample stand 4 is endowed with the function 21 of controlling a sample temperature, and the temperature of the sample 3 under treatment can also be controlled below a room temperature (about 20° C.), to the room temperature or so, and above the room temperature as is necessary. Besides, in case of treating a sample of large area (or in case of treating a plurality of samples), a treatment of good uniformity is realized by driving the sample stand 4 and the sample(s) 3 relative to the beam.

Figure 4:
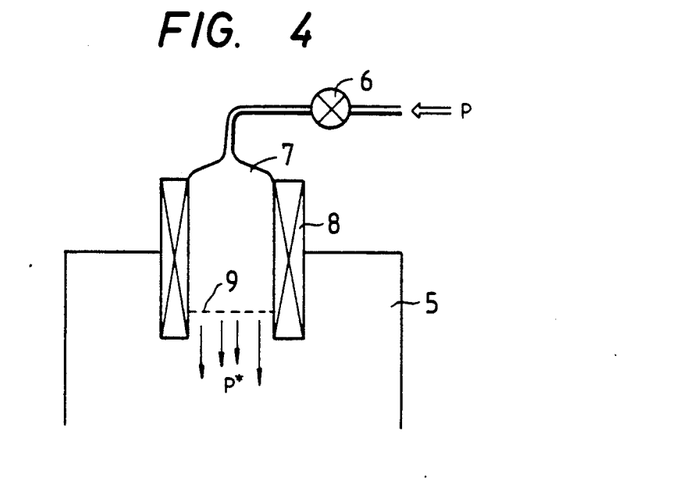
FIGS. 4, 5 and 6 are constructional views each showing an embodiment of active species beam-generating means for use in the surface treatment apparatus of the present invention.

FIG. 4 shows an embodiment of the active species beam-generating means 1. The embodiment comprises a gas introducing valve 6, a furnace 7, heating means 8 and pores 9. The active species beam-generating means 1 of the present embodiment shall be called the "furnace system." Atoms or molecules (hereinbelow, denoted by P) introduced into the furnace 7 through the gas introducing valve 6 are heated to a necessary temperature by the heating means 8, and some of them turn into the active species (hereinbelow, denoted by P*). When the species P are the molecules, the molecular structure of the active species P* is the same as that of the species P in some cases, and the species P dissociate to form the active species P* in the other cases. Usable for the heating means 8 are electrical resistance heating, heating with an infrared lamp. RF heating, etc. The active species P* become the active species beam of great translational energy when spurted from the single pore or the plurality of pores 9 into the vacuum chamber 5. The gas sometimes turns into the active species beam when merely spurted into the vacuum chamber 5 through the pores 9 without being heated. In this case, the heating means 8 becomes unnecessary.

Figure 5:
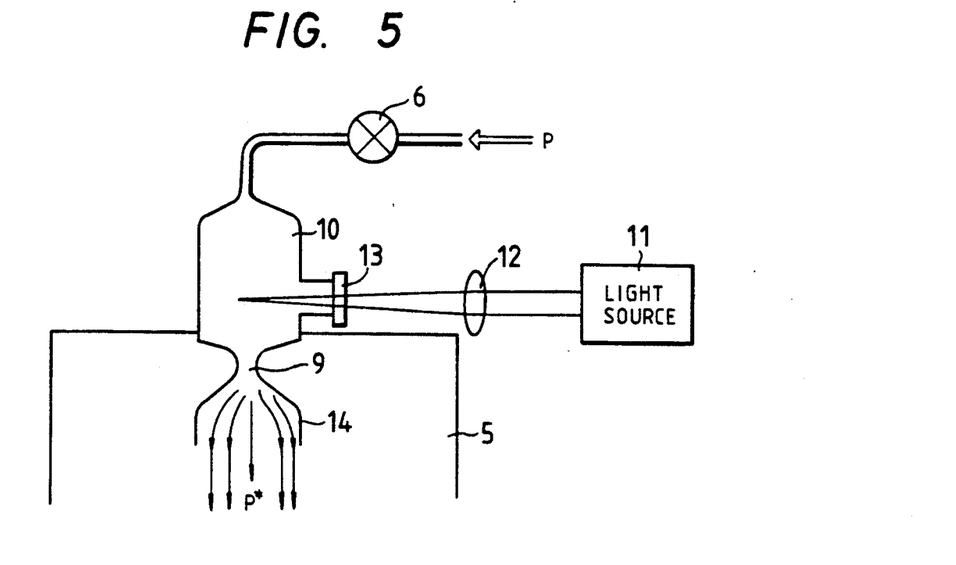

FIG. 5 shows another embodiment of the active species beam-generating means 1. A technique wherein gaseous particles are excited in a higher gas pressure region by the use of light, and the excited gas is spurted into a lower gas pressure region, thereby to treat a sample, is disclosed in British Patent Application No. 8412110. On the other hand, the present embodiment consists in a method in which energy states possessed by atoms or molecules are directly excited by the use of light so as to control the whole energy of the atoms or molecules. By way of example, the electronic states of inner shells can be excited by X-rays, the electronic states by ultraviolet or visible radiation, the vibrational states by infrared radiation, and the rotational states by microwaves. Referring to FIG. 5, the atoms or molecules P of a gas are introduced into a gas reservoir 10 through a gas introducing valve 6. Some of the atoms or molecules in the gas reservoir 10 are excited into active species P* by light which is emitted from a light source 11, condensed by a lens 12 and introduced through a window of the light transparency 13. As the light source 11, either a laser or an ordinary light lamp may be employed. The active species turn into an active species beam of great translational energy when spurted into the vacuum chamber 5 through an aperture 9. A guide nozzle 14 functions to adjust the flying direction of the active species beam. As the guide nozzle 14, it is possible to employ, for example, a De Laval nozzle which is often used in the field of gaseous fluids. The efficiency of turning the atoms or molecules into the active species can be heightened by reflecting the light within the gas reservoir 10 in multiple fashion in such a way that the inner wall of the gas reservoir 10 is made a reflective mirror surface or that a reflector is disposed in the gas reservoir 10.

Figure 6:
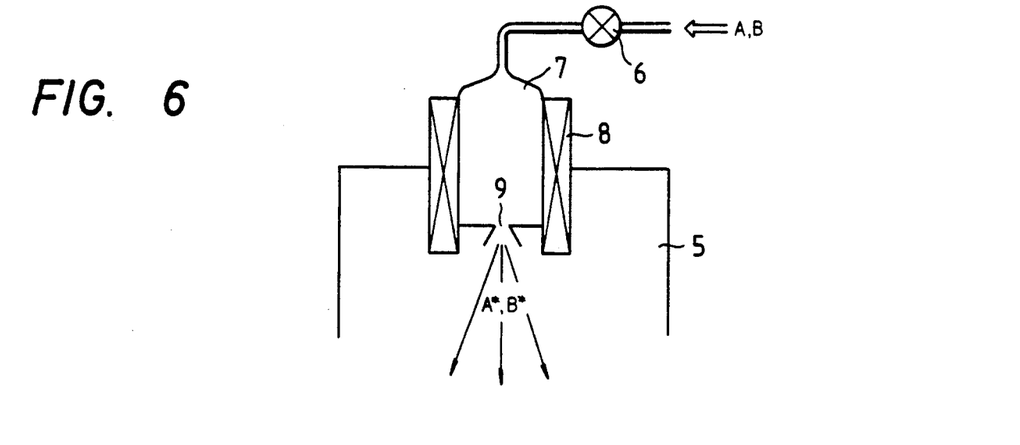

FIG. 6 shows an embodiment in which, by introducing gases A and B of two or more sorts (in the figure, two sorts are illustrated), the translational energy $E_5$ of the active species of the desired gas ($B^*$ in the explanation of the present embodiment) is controlled independently of the other energies ($E_r$, $E_v$, $E_e$). The construction and operation of the device are the same as those of the embodiment in FIG. 4. The present embodiment shall be called the "seeding system." In the present embodiment, the flow rate $Q_A$ of the gas A is set to be sufficiently larger than that $Q_B$ of the gas B. For example, $Q_A = a\ Q_B$ is st where $a > 10$ is held. However, $A > 10$ is not always required, but the value a differs depending upon cases. The gas A shall be called the "base gas," and the gas B the "seeding gas." On this occasion, the translational energy $E_{tA}$ of the active species $A^*$ of the gas A is determined by the heating temperature $T_f$ of the furnace 7, as follows:

$$E_{tA} = \tfrac{1}{2} m_A u_A^2$$

$$u_A = (2\ \gamma_c k\ T_f / m_A\ (\gamma_c - 1))^{\tfrac{1}{2}}$$

k: Boltzmann's constant,
$m_A$: mass of species A.
$\gamma_c$ denotes the ratio between the specific heat at a constant pressure and the specific heat at a constant volume, and $\gamma_c = (f+2)/f$ holds where f indicates the number of the degrees of freedom at which the species lose their energies at the spurt of the gas. $\gamma_c$ lies in a range of 5/3-1. At this time, the translational energy $E_{tB}$ of the active species $B^*$ becomes as given by Eq. [1].

That is, even when the furnace temperature $T_f$ is held constant, the translational energy $E_{tB}$ can be controlled by changing the value of $m_B/m_A$, namely, by changing the sort of the gas A. In general, the other energies, especially the vibrational energy $E_v$ are/is determined by the furnace temperature $T_f$. Therefore, the translational energy and vibrational energy of the active species $B^*$ formed from the seeding gas B are permitted to be controlled independently of each other by the seeding system. As the base gas A, it is often desirable to employ a chemically inactive gas, for example, a rare gas such as He, Ne, Ar, Kr, Xe or Rn.

Figure 7:
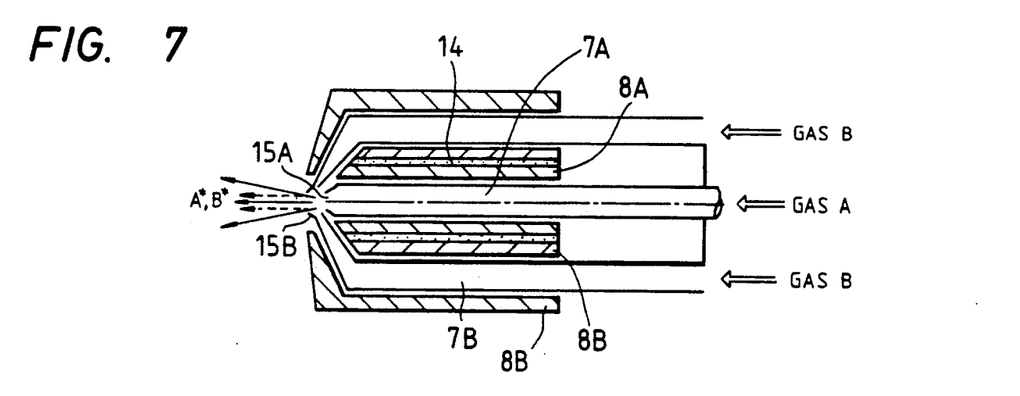
FIG. 7 is a sectional view showing an embodiment of the active species beam-generating means for use in the surface treatment apparatus of the present invention.

FIG. 7 shows another embodiment of the active species beam-generating means 1.

The construction of the device is in rotational-symmetry about a center axis (a dot-and-dash line) in the figure. Referring to FIG. 7, a gas A is heated in a furnace 7A and is thereafter spurted into vacuum through an exit 15A. The furnace 7A is heated to a high temperature by temperature control means 8A. (In some cases, however, the furnace 7A is cooled by the temperature control means 8A.) A gas B is passed through the interior of a furnace 7B and is thereafter spurted into the vacuum through an exit 15B so as to be mixed with the gas A. The furnace 7B is heated or cooled by temperature control means 8B. In addition, heat insulating means 14 is interposed between the temperature control means 8A and the temperature control means 8B, so that the furnaces 7A and 7B can have their temperatures controlled independently. If necessary, the heat insulating means 14 is furnished with a cooling function such as water cooling. In case of using the temperature control means 8A and 8B as the heating means, a heating method may be, for example, indirect Joule heating which employs heaters, direct Joule heating which causes currents to flow through the furnaces themselves, induction heating which employs RF power, or infrared heating. On the other hand, in case of using the temperature control means as the cooling means, it is possible to employ, for example, a liquid coolant such as water or liquid nitrogen or a gaseous coolant such as cooled He gas or freon gas.

In the embodiment of FIG. 7, the gas B is mixed into the gas A immediately after the spurt of the gas A. The timing of the mixing can be adjusted by changing the relative distance between the exits 15A and 15B. After the mixing of the gases A and B, the mixed gas expands while repeating the collisions between the species A and B, until it finally turns into a free species flow having no collisions between the species. The "suitable number of times of the collisions" stated before is realized by optimalizing the pressures of the A and B gases within the furnaces, the geometries of the exits, and the relative distance between the exits. In addition, although each of the exits 15A and 15B is formed of a single opening in FIG. 7, it may well be provided with a plurality of openings.

Suitable as the gas A is a chemically inactive gas, for example, a rare gas such as He, Ne, Ar, Kr, Xe or Rn. The gas B is a gas which is used for the chemical reaction of a surface treatment. By way of example, any of $SiH_4$, $Si_nH_m$, $GaH_3$, $AsH_3$, $PH_3$, etc. is employed for deposition or epitaxy; a gas of species containing a halogen element or hydrogen, such as $F_2$, $Cl_2$, $Br_2$, $NF_3$, HCl, HF, $SF_6$, $CF_4$, $C_nF_m$, $CCl_4$ or $C_nCl_m$ is employed for etching; and any of $O_2$, $N_2$, etc. is employed for surface modification. Each of the gases A and B may well be an elemental gas formed of a single species, or a mixed gas formed of a plurality of species.

Assuming that the speed of the species B finally becomes equal to the speed of the species A, and that the flow rate of the gas A is sufficiently greater than the flow rate of the gas B, the translational energy $E_{tB}$ of the species B becomes:

$$E_{tB} = \frac{m_B}{m_A} \frac{\gamma_{CA}}{\gamma_{CA} - 1} k T_{FA} \qquad [2]$$

$\gamma_{CA}$ denotes the ratio between the specific heat of the gas A at a constant pressure and the specific heat thereof at a constant volume, and $\gamma_{CA} = 5/3 = 1.67$ holds in a case where the gas A is a monoatomic molecule gas such as rare gas. In addition, k denotes the Boltzmann's constant, and $T_{fA}$ the temperature of the furnace 7A. When He-gas is employed as the gas A, and $F_2$-gas is employed as the gas B, the following holds:

$$E_{tB} = 23.8\ (k\ T_{fA}) \qquad [3]$$

and when $Cl_2$-gas is employed as the gas B, the following holds:

$$E_{IB} = 43.8 (k\, T_{fA}) \qquad [4]$$

Figure 8:
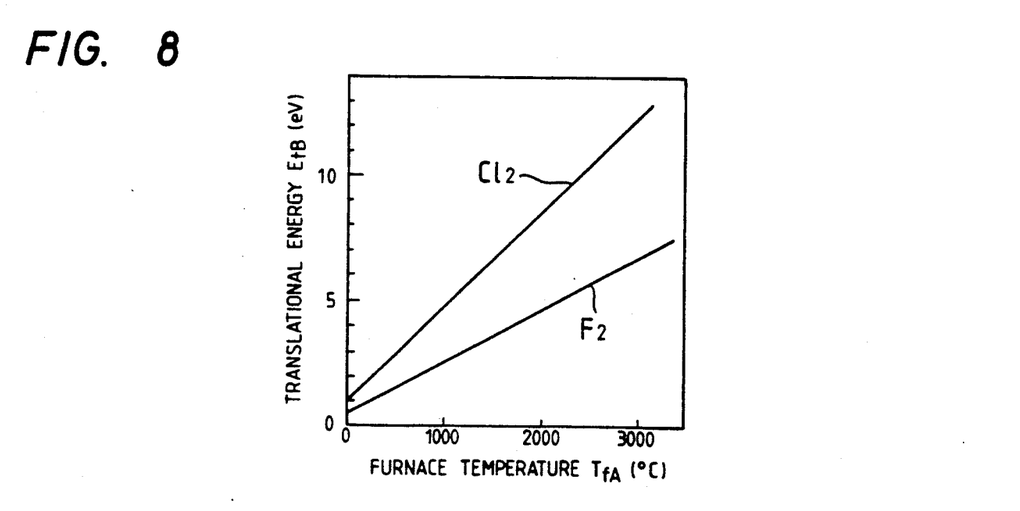
FIG. 8 is a graph showing the relations between the temperature $T_{fA}$ of a furnace and the translational energy $T_{tB}$ of B species.

FIG. 8 shows the relations of $E_{IB}$ and $T_{fA}$ obtained from Eqs. [3] and [4], as to the cases of $F_2$ and $Cl_2$. It is seen from the figure that $E_{IB}$ values of several eV can be attained with ease. The effect of the present invention becomes clear when the embodiment is compared with a case where the $F_2$- or $Cl_2$-gas is heated and spurted into vacuum alone. The translational energy $E_t$ of $F_2$ or $Cl_2$ in this case becomes:

$$E_t = 3.5\, k\, T_f \qquad [5]$$

where $T_f$ indicates a temperature to which the $F_2$- or $Cl_2$-gas is heated. With this method, $E_t$ is 0.98 eV even when $T_f = 3000°$ C. is set. Moreover, it is very difficult to heat the $F_2$-gas or $Cl_2$-gas to such a high temperature without the reaction thereof with a furnace wall or the dissociation thereof.

In the embodiment of FIG. 7, a fast neutral species beam composed of the B species whose internal energies (vibrational energy, rotational energy and electronic energy) are in raised states (excited states) can be obtained when the gas B is heated by the temperature control means 8B and is thereafter spurted through the exit 15B. Such a species beam has a higher reactivity, and is useful for surface treatments.

The present embodiment has been described as causing the inactive or nonreactive gas A to flow through the furnace 7A, and the reactive gas B to flow through the furnace 7B. Needless to say, however, a similar effect and operation are achieved even when the gases are replaced with each other, that is, when the gas A is caused to flow through the furnace 7B and the gas B through the furnace 7A. However, the shapes of the exits 15A and 15B need to be optimized according to the combination of the individual gases.

The feature of the present embodiment consists in the structure in which the furnace 7B envelops the furnace 7A. Thus, the entire device can be structurally simplified, and also the occupation volume thereof can be reduced. However, there is the problem that the thermal insulation between the temperature control means 8A and 8B is difficult.

Figure 9:
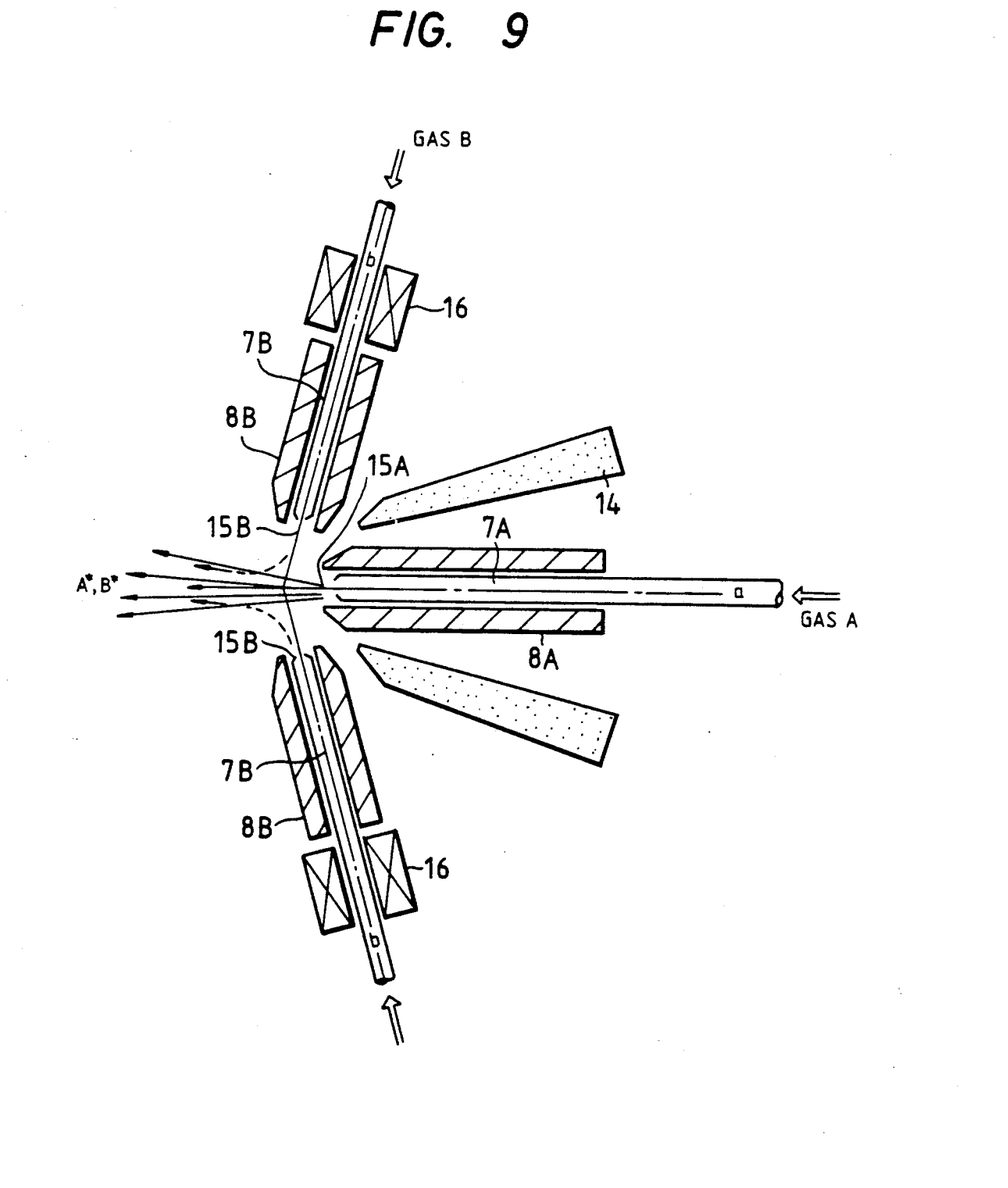
FIG. 9, FIG. 10A and FIG. 10B are sectional views each showing an embodiment of the active species beam-generating means for use in the surface treatment apparatus of the present invention.

FIG. 9 shows a modification to the embodiment in FIG. 7. In FIG. 9, the operations of respective constituents are the same as in the embodiment of FIG. 7. Referring to FIG. 9, the furnace 7A and the temperature control means 8A are substantially in rotational-symmetry about a center axis a, and the furnaces 7B and the temperature control means 8B are substantially in rotational-symmetry about corresponding center axes b. Besides, the heat insulating means 14 is substantially in rotational-symmetry about the center axis a. That is, the furnace 7A as well as the temperature control means 8A and the furnaces 7B as well as the temperature control means 8B are structurally separated. This brings forth the advantage that the thermal insulations among the temperature control means are facilitated. On the other hand, there is the problem that the flow of the gas B fails to be rotationally symmetric about the center axis a. Therefore, the plurality of supply lines (furnaces 7B) for the gas B are provided and are arranged at equal angles about the center axis a.

In the modification of FIG. 9, discharge generation means 16 serve to generate the electric discharges of the gas B. Since gaseous molecules are dissociated by the discharges, a fast neutral species beam of species unavailable with an ordinary stable gas can be obtained. By way of example, $F_2$ ($Cl_2$) is supplied as the gas B and is discharged, whereby a fast neutral species beam of F (Cl) being the dissociation product of $F_2$ ($Cl_2$) can be obtained. It is needless to say that a similar effect is achieved even when the gas is irradiated with any of a laser beam, ultraviolet radiation, X-rays, etc. instead of the use of the discharge generation means 16.

Figure 10A:
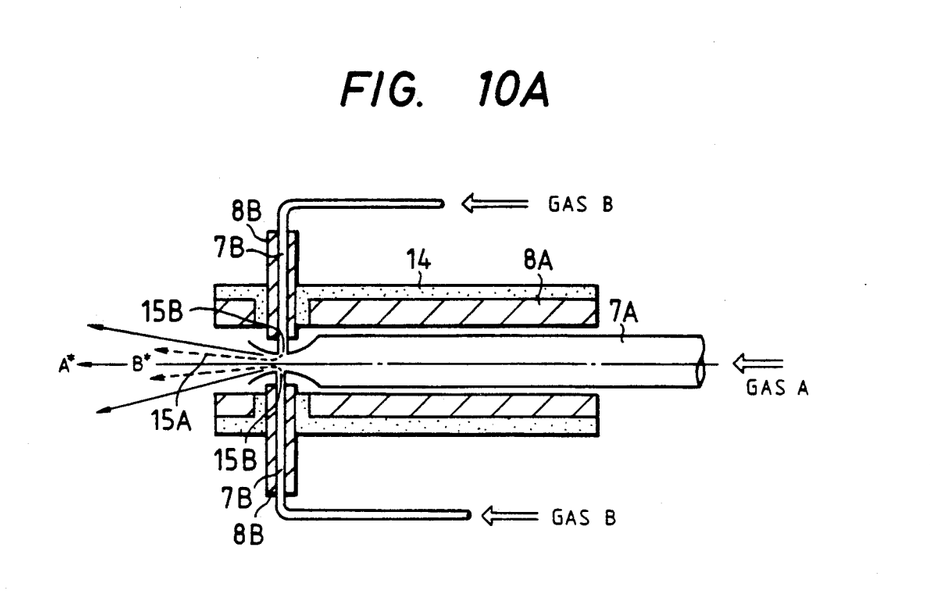
Figure 10B:
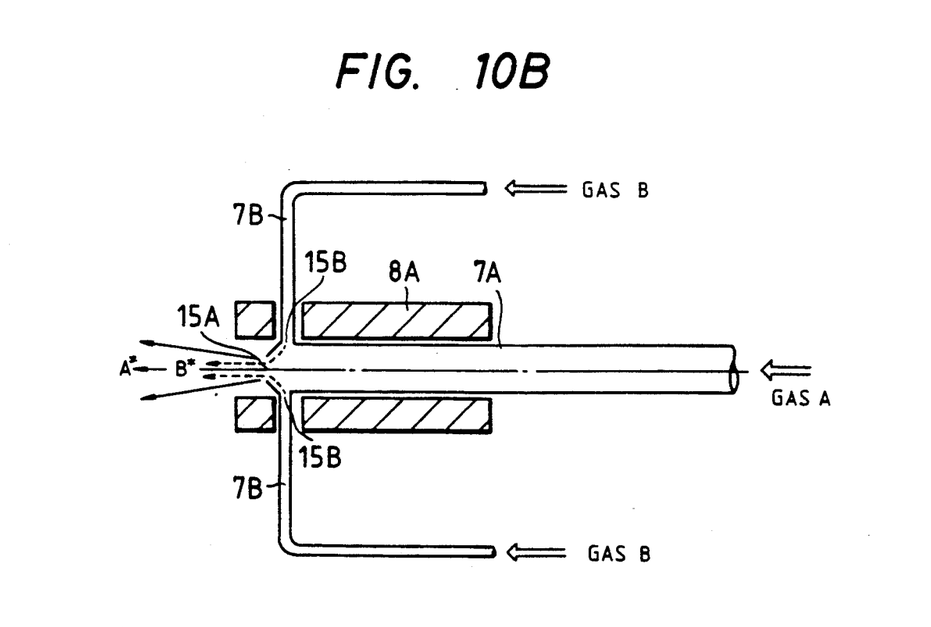

FIGS. 10A and 10B show further embodiments of the active species beam-generating means 1. The operations of respective constituents are the same as in the embodiment of FIG. 7. The feature of each of the embodiments is that the gas B and the gas A are mixed amidst the spurt of the gas A (FIG. 10A) or immediately before the spurt (FIG. 10B). That is, in the embodiment of FIG. 10A, the exit portion for the spurt is lengthened so as to mix the gases amidst the spurt, while in the embodiment of FIG. 10B, the exit portion is shaped so as to mix the gases immediately before the spurt. Thus, the number of times of the collisions between the species A and B after the mixing increases, and the species B are accelerated more sufficiently. As stated before, however, there is the problem that the species B become liable to dissociate.

In the above, the present invention has been described as to the apparatus and method for forming the fast species beam of the electrically neutral species. It is needless to say, however, that similar effects can be expected even for species having charges (positive or negative ions) if they need to be used.

Figure 11:
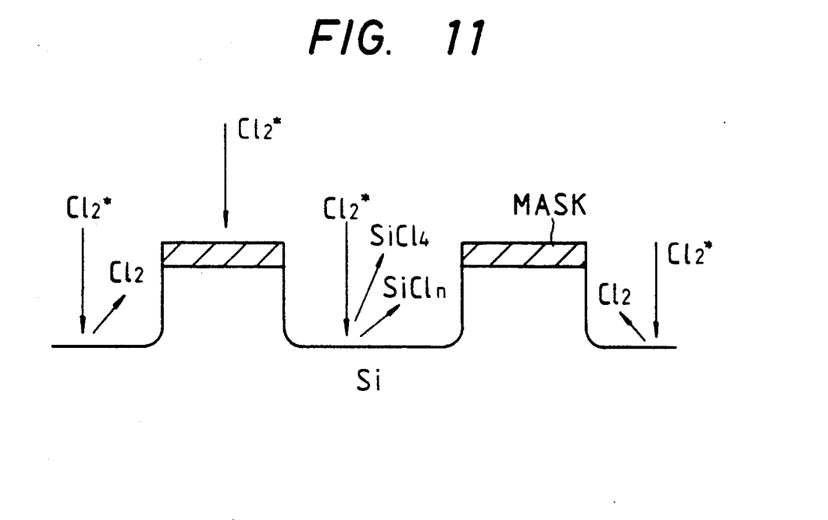
FIG. 11 is a sectional view illustrative of etching according to the present invention.

FIG. 11 shows a situation where vertical etching without an undercut can be realized with an active species (P*) beam. By way of example, in order to etch an Si substrate, a molecular gas containing a halogen element, such as $F_2$, $Cl_2$, $Br_2$, FCl, $SF_6$, $NF_3$, $CCl_4$, $C_nF_m$ or $C_nCl_m$ is employed as an introducing gas for forming the active species P*. As a result, the introducing gas molecules are excited without dissociating or are dissociated and excited, thereby to form the beam of the active species P*. By way of example, a case where the active species are those $Cl_2^*$ of chlorine molecules will be explained below. When the active species $Cl_2^*$ enter the surface of Si, some of them produce $SiCl_4$ through a chemical reaction:

$$Si + 2Cl_2 \rightarrow SiCl_4$$

Since the vapor pressure of $SiCl_4$ is high, this product vaporizes from the surface and etches the Si surface. The reaction product is sometimes $SiCl_n$ ($n \leq 3$) apart from the above product $SiCl_4$. The active species $Cl_2^*$ not having reacted reflect off the Si surface. On this occasion, they are deprived of part of their energy to lose chemical reactivities. In consequence, even when the $Cl_2$ molecules having reflected enter the side wall of a pattern under etching, the place is not etched. As a result, a mask pattern is projected or transferred in the direction in which the beam enters, and the Si surface is microfabricated faithfully to the mask pattern. In the present embodiment, the etching of the Si substrate has been referred to. However, regarding other materials, for example, semiconductors such as GaAs and InP, metals such as W, Mo, Al, Ta, Ni and Ti and the silicides thereof, and insulators such as $Si_3N_4$ and $SiO_2$, the vertical etching can be done on the basis of the same principle by selecting the introducing gas.

Figure 12:
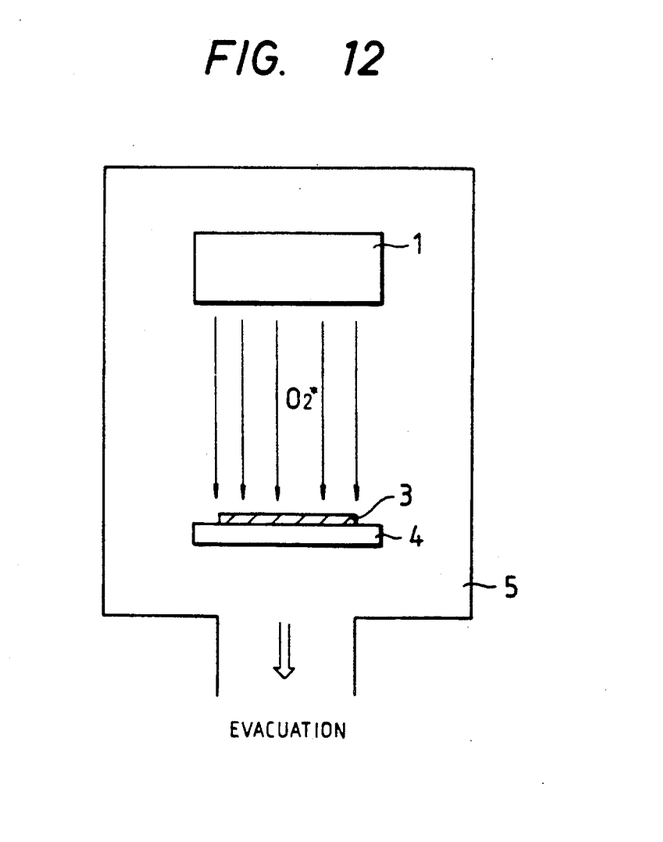
FIGS. 12, 13, 14, 15 and 16 are constructional views each showing an embodiment of the surface treatment apparatus of the present invention.

FIG. 12 shows an embodiment which modifies a surface by the use of an active species beam. The operations of respective constituents are the same as in FIG. 1. FIG. 12 exemplifies oxidation in which the active species ($O_2^*$) beam of oxygen molecules is employed. By way of example, when a sample is of Si, the incident active species $O_2^*$ produce $SiO_2$ through a reaction:

$$Si + O_2 \rightarrow SiO_2$$

whereby the surface of the sample is oxidized. Even when the sample is of a substance other than Si, for example, a semiconductor such as GaAs or InP or a metal such as W, Mo, Al, Ti, Ta, Ni or Pb, it can be similarly oxidized. In addition to the oxidation, nitrification can be similarly performed with $N_2^*$ by way of example, and progress to other surface modifications is also possible. The feature of the surface modification of the present system is that, since neither ions nor electrons are used, the surface modification free from surface damages can be carried out at a low temperature.

Figure 13:
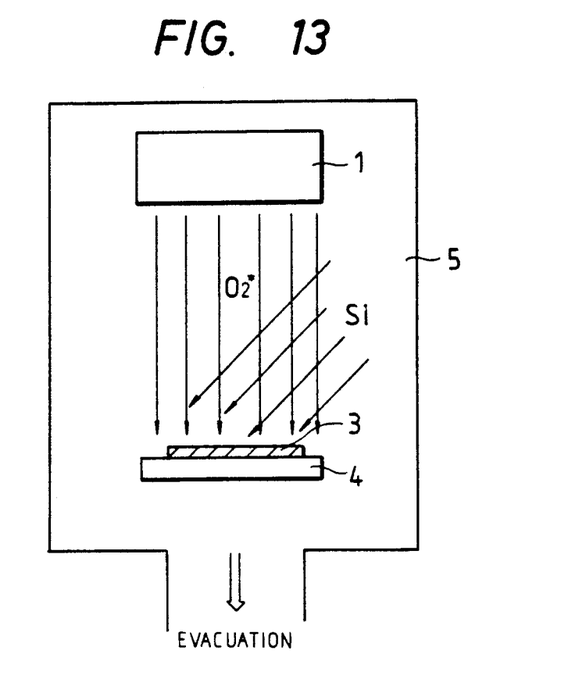

FIG. 13 shows an embodiment in which an $SiO_2$ film is deposited on the surface of a sample. The operations of respective constituents are the same as in FIG. 1. The active species beam of oxygen ($O_2^*$ beam) and the atoms of Si enter the surface of the sample 3. $O_2^*$ and Si having entered react as:

$$O_2^* + Si \rightarrow SiO_2$$

thereby to deposit $SiO_2$ on the surface. The feature of this method as compared with the embodiment in FIG. 12 is that the method in FIG. 12 is difficult of thickening a modified layer, whereas the method of the present embodiment can form an $SiO_2$ film of any desired thickness with ease. Although the deposition of the $SiO_2$ film has been referred to in the present embodiment, a nitrified film of Si ($Si_3N_4$) can be deposited by replacing $O_2^*$ with $N_2^*$. In addition, when another material is caused to enter instead of the Si atoms, an oxide film or nitride film thereof can be deposited.

Figure 14:
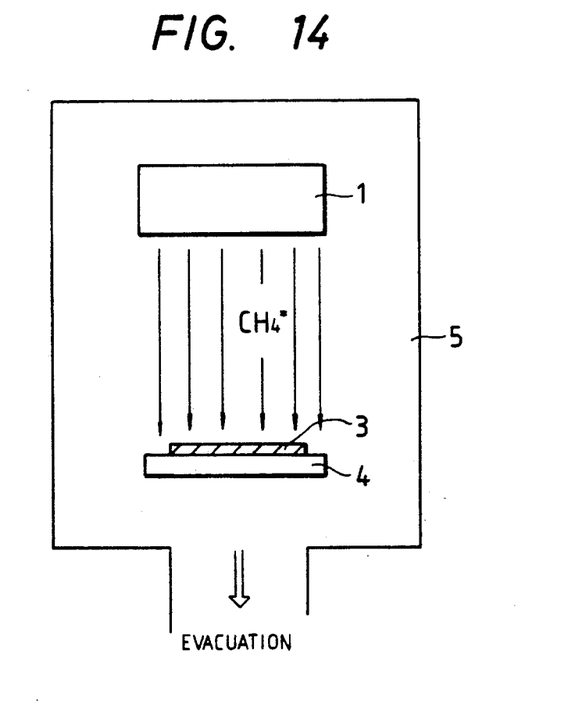

FIG. 14 shows an embodiment for different film deposition. The operations of respective constituents are the same as in FIG. 1. The present embodiment is a method in which active species having entered a surface, themselves dissociate or react to deposit a film. Shown in the figure is an example in which the film of a substance whose component is carbon C (graphite, diamond, polycrystalline carbon, or hydrocarbon) is deposited using the beam of active species $CH_4^*$. When the active species $CH_4^*$ enter the surface, they dissociate owing to their own energy and form C or $CH_n$ ($n \leq 3$), whereby the film whose component is the carbon or the hydrocarbon is deposited on the surface. When the active species of different atoms or molecules are caused to enter, a different film can be deposited by a similar method.

Figure 15:
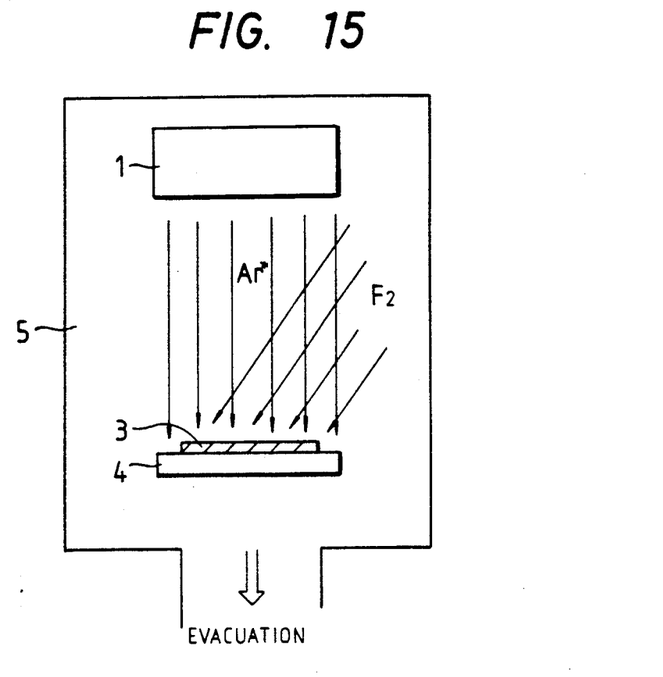

FIG. 15 shows an etching method which differs from the method in FIG. 11. The operations of respective constituents are the same as in FIG. 1. This method is such that energy necessary for an etching reaction is supplied as the energy of an active species beam, while a substance necessary for the reaction is separately supplied. This method shall be called the "etching assisted by an active species beam." Shown in FIG. 15 is an example in which an $Ar^*$ beam is employed as the active species beam, while $F_2$-gas is employed as a reactant supply gas. $F_2$ may be supplied either as a beam of isotropic velocity distribution or as a beam of anisotropic velocity distribution. When the sample 3 is of Si, a reaction product $SiF_4$ of high vapor pressure is produced through a reaction:

$$Si + 2F_2 + Ar^* \rightarrow SiF_4 + Ar$$

and it comes off, whereby the sample is etched. On this occasion, the energy of $Ar^*$ is used as the activation energy of the reaction. Although the present embodiment has referred to the case of the Si sample, the other sample materials as mentioned in the embodiment of FIG. 11 can be similarly etched. In addition, as the reactant supply gas, it is possible to employ another gas, for example, a gas containing a halogen element such as $Cl_2$, $Br_2$, FCl, $SF_6$ or $NF_3$. Besides, as the beam of active species, the $Ar^*$ beam can also be substituted by the active species beam of another rare gas or the active species beam of another kind of chemically stable molecules (for example, $CO_2$).

Figure 16:
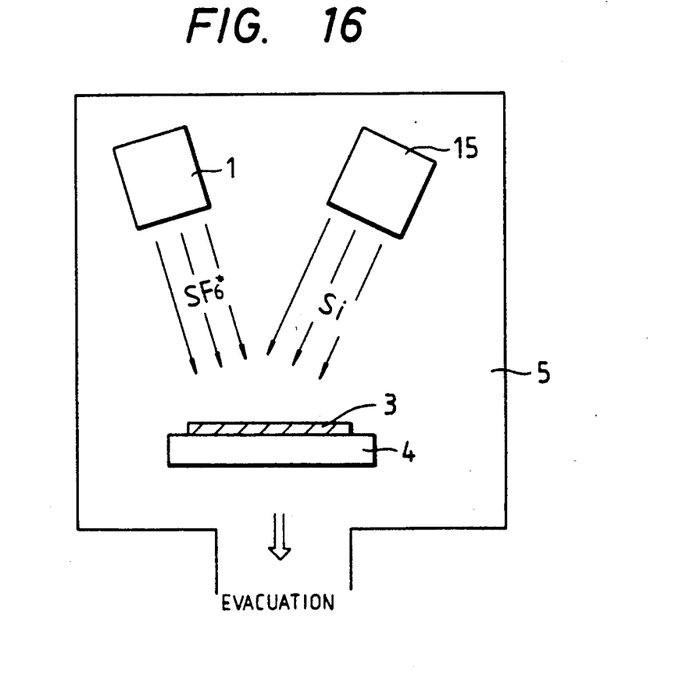
Figure 17:
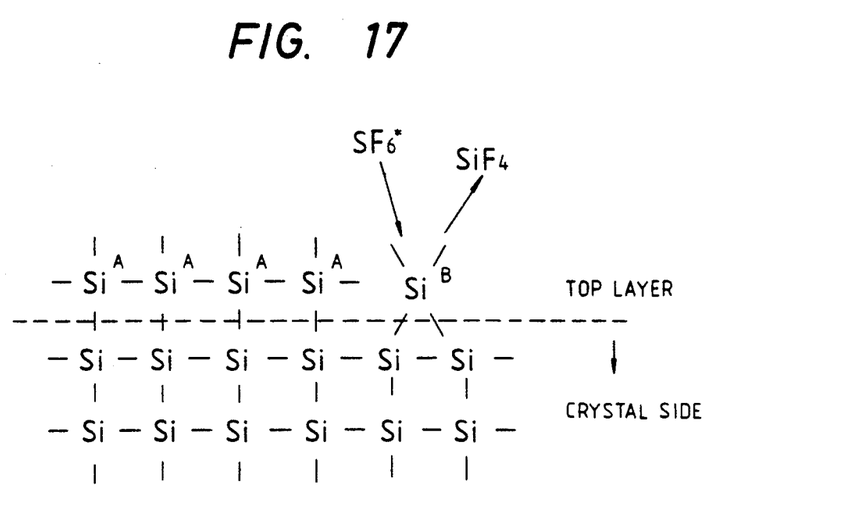
FIG. 17 is an explanatory view showing a process of epitaxy.

FIG. 16 shows another embodiment of the present invention. The present embodiment discloses a method in which the epitaxy of a crystal is carried out at a low temperature. While the epitaxy of Si (silicon) will be explained below, a similar method is applicable to the epitaxy of another crystal. The apparatus of the embodiment comprises active species beam-generating means 1, Si beam-generating means 15, a sample stand 4 for a sample 3, and a vacuum chamber 5. Active species adapted to etch Si at a suitable rate, for example, $SF_6^*$ are employed as the active species of the active species beam-generating means 1. In addition, the sample stand 4 is furnished with suitable heating means. Si atoms or Si molecules ($Si_n$) having flown from the Si beam-generating means 15 sticks on the surface of the sample 3 to grow the crystal. The growth process of the Si crystal is schematically shown in FIG. 17. The indication of a "crystal side" signifies a part where single-crystalline Si has already been formed, while the indication of a "top layer" signifies a part where the Si crystal is being formed. Some of the Si atoms having flown to the surface stick to exact crystal positions (correct positions) as indicated at $Si^A$ in FIG. 17, and the others stick to undesired positions (incorrect positions) as indicated at $Si^B$. When the deposition process proceeds under this state, the crystal does not grow to be single-crystalline but grows to be polycrystalline. The method of the present embodiment removes (etches) only the Si atoms of the incorrect positions ($Si^B$) by the use of the active species ($SF_6^*$) beam, and permits the single-crystal growth based on only the Si atoms of the correct positions ($Si^A$). The fact that such selective etching dependent on the deposition positions is possible, is interpreted as follows: The crystal energy between the Si atom of the incorrect position and the crystal side Si is less than the bond energy between the Si atom of the correct position and the crystal side Si. Accordingly, only the Si atoms $Si^B$ can be selectively etched by properly setting the energy of the active species $SF_6^*$.

In conventional Si epitaxy (for example, molecular beam epitaxy (MBE)), the growth of a single crystal has been realized in such a way that a sample is heated to a high temperature (600°-800° C.), whereby Si atoms at incorrect positions are caused to migrate to correct positions by thermal motions. With this method, however, the treatment temperature is too high, and the range of applications has been extremely limited. In contrast, with the method of the present embodiment, the single-crystal growth at a low temperature becomes possible, and the range of applications widens. The method is very effective especially for processes for three-dimensional devices in the future. Although the epitaxy (single-crystal growth) has been explained in the present embodiment, the growth of a film of polycrystal having an appropriate grain size is also permitted by properly selecting the magnitude of the energy of $SF_6^*$. The method in this case belongs to deposition technology. In addition, although the present embodiment has indicated the example employing the $SF_6^*$ beam, another active species beam, particularly the active species beam of atoms or molecules containing a halogen element can also be employed.

Figure 18:
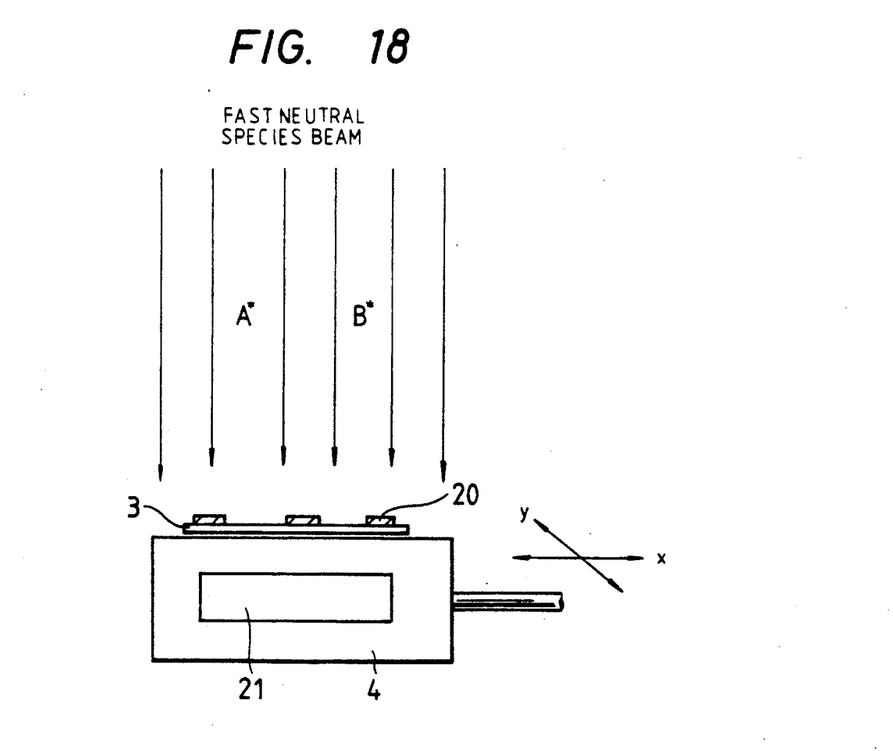
FIG. 18 is a constructional view showing an embodiment of the surface treatment apparatus of the present invention.

FIG. 18 shows an example of construction of a surface treatment apparatus which employs a fast neutral species beam. Referring to the figure, the fast neutral species beam enters the surface of a sample 3, and a surface treatment is performed using the species beam as means for the treatment (or as part of the means). The sample surface is partly covered with a mask 20, and only the necessary part thereof is treated. The sample 3 is set on a sample stand 4. This sample stand is provided with sample temperature control means 21, by which the temperature of the sample 3 is controlled. The sample 3 can be heated and cooled by the sample temperature control means 21. In addition, if necessary, the sample 3 and the sample stand 4 can be driven relative to the species beam, so that a surface treatment of good uniformity is possible.

According to the present invention, an active species beam which has translational energy in a range of 0.01-100 eV is employed, so that a surface treatment which involves very little surface damages and which is directional becomes possible. The present invention is optimal especially for semiconductor processes.

We claim:

1. A surface treatment method comprising the steps of heating gases which contain first species and second species differing in mass from said first species, and spurting the heated gases into vacuum and causing said first species to collide with said second species, thereby to change translational energy of said second species, whereby said second species are formed into a species beam whose translational energy is greater than 1 eV and not more than 100 eV, and irradiating a sample with said species beam so as to treat a surface of said sample.

2. A surface treatment method according to claim 1, wherein said first species are chemically inactive species, and said second species are electrically neutral species.

3. A surface treatment method according to claim 1, wherein said second species are greater in mass than said first species, and the translational energy of said second species is increased by the collisions.

4. A surface treatment method according to claim 1, wherein the translational energy of said species beam is controlled by changing a ratio between the mass of said first species and the mass of said second species.

5. A surface treatment method according to claim 4, wherein vibrational energy of said species beam is controlled by controlling a temperature of the heating.

6. A surface treatment method according to claim 1, wherein the gas formed of said first species is a rare gas.

7. A surface treatment method according to claim 1, wherein said second species are species which contain a halogen element.

8. A surface treatment method according to claim 1, wherein said second species are species which contain the hydrogen element.

9. A surface treatment method according to claim 1, wherein said second species are species which contain the oxygen element.

10. A surface treatment method according to claim 1, wherein said second species are species which contain the nitrogen element.

11. A surface treatment method according to claim 1, wherein a gas containing said second species is mixed into a gas containing said first species not earlier than a time immediately before the spurt of said gas containing said first species.

12. A surface treatment method according to claim 11, wherein said second species removes substances of said surface of said sample.

13. A surface treatment method according to claim 11, wherein a component of said second species is deposited on said surface of said sample.

14. A surface treatment method according to claim 11, wherein said second species chemically reacts with a substance of said surface of said sample.

15. A surface treatment method according to claim 14, wherein said surface of said sample undergoes oxidation.

16. A surface treatment method according to claim 14, wherein said surface of said sample undergoes nitridation.

17. A surface treatment method comprising the steps of heating a first species of gas, spurting said first species of gas into vacuum, mixing a second species of gas into said first gas at a time which is not earlier than a time immediately before the spurt of said first species of gas and thus causing said first species of gas and said second species of gas to collide, thereby to form said second species of gas into an activated gas beam which contains activated second species of gas whose translational energy is greater than 1 eV and not more than 100 eV, and irradiating a sample with said activated gas beam so as to treat a surface of said sample.

18. A surface treatment method according to claim 17, wherein said first gas is a rare gas.

19. A surface treatment method according to claim 17, wherein said second gas is composed of species containing a halogen element.

20. A surface treatment method according to claim 17, wherein said second gas is composed of species containing the hydrogen element.

21. A surface treatment method according to claim 17, wherein said second gas is composed of species containing the oxygen element.

22. A surface treatment method according to claim 17, wherein said second gas is composed of species containing the nitrogen element.

23. A surface treatment method according to claim 17, wherein said second species of gas is mixed into said heated first species of gas at a time immediately before the spurting of said heated first species of gas.

24. A surface treatment method according to claim 17, wherein said second species of gas is mixed into said heated first species of gas at a time amidst the spurting of said heated first species of gas.

25. A surface treatment method according to claim 17, wherein said second species of gas is mixed into said heated first species of gas at a time immediately after the spurting of said heated first species of gas.

* * * * *